United States Patent
Lee et al.

(10) Patent No.: US 7,514,315 B2
(45) Date of Patent: Apr. 7, 2009

(54) METHODS OF FORMING CAPACITOR STRUCTURES HAVING ALUMINUM OXIDE DIFFUSION BARRIERS

(75) Inventors: Jong-Cheol Lee, Seoul (KR); Kyoung-Ryul Yoon, Goyang-si (KR); Ki-Vin Im, Suwon-si (KR); Jae-Hyun Yeo, Bucheon-si (KR); Eun-Ae Chung, Suwon-si (KR); Jin-Il Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 160 days.

(21) Appl. No.: 11/733,970

(22) Filed: Apr. 11, 2007

(65) Prior Publication Data

US 2007/0257370 A1   Nov. 8, 2007

(30) Foreign Application Priority Data

May 3, 2006   (KR) ............... 10-2006-0039972

(51) Int. Cl.
*H01L 21/8242* (2006.01)
*H01L 21/20* (2006.01)

(52) U.S. Cl. .............. 438/238; 438/239; 438/240; 438/396; 438/770; 257/E21.008; 257/E21.648; 257/E21.649

(58) Field of Classification Search .......... 257/E21.008, 257/E21.648, E21.649
See application file for complete search history.

(56) References Cited

U.S. PATENT DOCUMENTS

| 6,323,083 | B1 | 11/2001 | Park et al. | |
|---|---|---|---|---|
| 2003/0092277 | A1* | 5/2003 | Kondo | ............ 438/710 |
| 2007/0023810 | A1 | 2/2007 | Baik et al. | |
| 2008/0003766 | A1* | 1/2008 | Eun | ............ 438/396 |

FOREIGN PATENT DOCUMENTS

| JP | 2001-85639 A | 3/2001 |
|---|---|---|
| KR | 2000-0045865 A | 7/2000 |
| KR | 2003-0002905 A | 1/2003 |
| KR | 10-2004-0059833 A | 7/2004 |
| KR | 10-2005-0040160 A | 5/2005 |

\* cited by examiner

*Primary Examiner*—Walter L Lindsay, Jr.
*Assistant Examiner*—Mohsen Ahmadi
(74) *Attorney, Agent, or Firm*—Myers Bigel Sibley & Sajovec, P.A.

(57) ABSTRACT

A multilayer electrode structure has a conductive layer including aluminum, an oxide layer formed on the conductive layer, and an oxygen diffusion barrier layer. The oxide layer includes zirconium oxide and/or titanium oxide. The oxygen diffusion barrier layer is formed at an interface between the conductive layer and the oxide layer by re-oxidizing the oxide layer. The oxygen diffusion barrier layer includes aluminum oxide.

8 Claims, 8 Drawing Sheets

METHODS OF FORMING CAPACITOR STRUCTURES HAVING ALUMINUM OXIDE DIFFUSION BARRIERS

CROSS-REFERENCE TO RELATED APPLICATIONS

This application claims the benefit under 35 USC §119 of Korean Patent Application No. 10-2006-0039972, filed on May 3, 2006, the disclosure of which is hereby incorporated herein by reference in its entirety as if set forth fully herein.

FIELD OF THE INVENTION

The present invention relates to multilayer electrode structures, methods of forming multilayer electrode structures, capacitors including multilayer structures, and methods of forming capacitors.

BACKGROUND OF THE INVENTION

Integrated circuit devices are widely used in many consumers, commercial and other applications. In order to increase the integration density of the integrated circuit devices, it may be desirable to form smaller and smaller devices.

Generally, memory devices such as dynamic random access memory (DRAM) and logic devices include capacitors. As is well known to those having skill in the art, a capacitor includes two closely spaced apart electrodes with a dielectric therebetween. A lower or bottom electrode may be referred to as a "storage electrode", and an upper or top electrode may be referred to as a "plate electrode". It is generally desirable for a capacitor to have a fixed density and stable properties relative to an applied voltage. A capacitor having a polysilicon insulator polysilicon (PIP) structure has been widely employed in memory devices or logic devices. Since polysilicon is stable at a high temperature and a chemical vapor deposition (CVD) process may be used, the capacitor of the PIP structure may be easily manufactured.

However, a capacitance of the capacitor having the PIP structure may vary in accordance with an applied voltage. Particularly, depletion layers may be formed between the lower electrode and an insulation layer and between the insulation layer and the upper electrode when a voltage is applied to the capacitor having the PIP structure, because the lower and the upper electrodes include doped polysilicon. As the depletion layers are formed, a thickness of the insulation layer may increase so that the capacitor may not have a stable capacitance. Further, the capacitance of the capacitor having the PIP structure may be reduced further when the capacitor is employed in a highly integrated semiconductor device having a design rule below about 90 nm.

A capacitor having a metal-insulator-metal (MIM) structure has also been developed. The capacitor of the MIM structure includes electrodes composed of metal. For example, Korean Laid-Open Patent Publication No. 2003-2905 discloses a method of forming a capacitor having a MIM structure. In the method of forming the capacitor, a dielectric layer including tantalum oxide is formed on a lower electrode of titanium aluminum nitride. A heat treatment process is performed on the dielectric layer at a temperature of about 300° C. to about 500° C. using an oxygen plasma or UV/$O_3$ so as to re-oxidize the dielectric layer. Then, a rapid thermal process or a furnace annealing process is executed on the dielectric layer. When the dielectric layer is re-oxidized and thermally treated, an aluminum oxide layer is formed between the lower electrode and the dielectric layer. The aluminum oxide layer may prevent an oxidation of the lower electrode.

However, a thickness of the aluminum oxide layer formed at the interface between the lower electrode and the dielectric layer may be large during re-oxidizing and thermally treating the dielectric layer at a high temperature. The aluminum oxide layer has a low dielectric constant such that dielectric characteristics of the dielectric layer may be deteriorated when the aluminum oxide layer is thick. As a result, the capacitor including the aluminum oxide layer may have a lower capacitance.

SUMMARY OF THE INVENTION

Example embodiments of the present invention can provide multilayer structures including a dielectric layer that can have a high dielectric constant and a methods of forming the multilayer structure.

Example embodiments of the present invention can provide capacitors including the multilayer structures and methods of forming the capacitors.

According to some embodiments of the invention, there are provided multilayer electrode structures that include a conductive layer including aluminum, an oxide layer on the conductive layer, and an oxygen diffusion barrier layer between the conductive layer and the oxide layer. As used herein, an "oxygen diffusion barrier layer" means a layer that reduces or even prevents diffusion of oxygen thereacross. The oxide layer includes zirconium oxide and/or titanium oxide, and the oxygen diffusion barrier layer includes aluminum oxide. The oxygen diffusion barrier layer may be formed by re-oxidizing the oxide layer. In some embodiments, the oxygen diffusion barrier is directly on the conductive layer, and the oxide layer is directly on the oxygen diffusion barrier. In other embodiments, a plate electrode is provided on the oxide layer to provide a capacitor.

In example embodiments of the present invention, the oxygen diffusion barrier layer may have thickness between about 2 Å and about 5 Å. For example, a thickness ratio between the oxide layer and the oxygen diffusion barrier layer may be in a range of about 15:1 to about 25:1.

In example embodiments of the present invention, the conductive layer may include titanium aluminum nitride and/or tantalum aluminum nitride.

According to another aspect of the present invention, there are provided methods of forming a multilayer electrode structure. In these methods of forming the multilayer electrode structure, after forming a conductive layer including aluminum, an oxide layer including zirconium oxide and/or titanium oxide is formed on the conductive layer. An oxygen diffusion barrier layer including aluminum oxide is formed at an interface between the conductive layer and the oxide layer by re-oxidizing the oxide layer.

In example embodiments of the present invention, the conductive layer may be formed using a titanium precursor including titanium chloride ($TiCl_4$), at least one nitrogen precursor including ammonia ($NH_3$) and an aluminum precursor including trimethyl aluminum (TMA).

In example embodiments of the present invention, the oxide layer may be formed using a zirconium precursor and an oxidizing agent and/or using a titanium precursor and an oxidizing agent.

In example embodiments of the present invention, re-oxidizing the oxide layer may be performed using an oxygen plasma.

In example embodiments of the present invention, the oxide layer may be crystallized during re-oxidizing the oxide layer.

According to still other embodiments of the present invention, there are provided capacitors that include a storage electrode including aluminum, a dielectric layer on the storage electrode, an oxygen diffusion barrier layer at an interface between the storage electrode and the dielectric layer, and a plate electrode on the dielectric layer. The dielectric layer includes zirconium oxide and/or titanium oxide. The oxygen diffusion barrier layer includes aluminum oxide. The oxygen diffusion barrier layer is formed by re-oxidizing the dielectric layer.

In example embodiments of the present invention, the storage electrode may include titanium aluminum nitride and/or tantalum aluminum nitride.

In example embodiments of the present invention, a thickness ratio between the oxygen diffusion barrier layer and the dielectric layer may be in a range of about 1:15 to about 1:25.

In example embodiments of the present invention, the plate electrode may include radium or titanium nitride.

According to still other embodiments of the present invention, there are provided methods of forming a capacitor. In these methods of forming the capacitor, a storage electrode including aluminum is provided, and then a dielectric layer including zirconium oxide and/or titanium oxide is formed on the storage electrode. After an oxygen diffusion barrier layer including aluminum oxide is formed at an interface between the storage electrode and the dielectric layer by re-oxidizing the dielectric layer, a plate electrode is formed on the dielectric layer.

In example embodiments of the present invention, re-oxidizing the dielectric layer may be performed using an oxygen plasma.

In example embodiments of the present invention, the oxygen diffusion barrier layer may be formed at between about 200° C. and about 400° C. for about 2 to about 5 minutes.

In example embodiments of the present invention, the storage electrode may be formed using a titanium precursor including titanium chloride, at least one nitrogen precursor including ammonia and an aluminum precursor including trimethyl aluminum.

In example embodiments of the present invention, the oxide layer may be formed using a zirconium precursor and an oxidizing agent or using a titanium precursor and an oxidizing agent. Examples of the zirconium precursor may include tetra-tertiary-butoxy zirconium ($Zr(OtBu)_4$), tetrakis-ethyl-methyl-amino zirconium ($Zr[N(CH_3)(C_2H_5)_4]$), zirconium iso-propoxide ($Zr(OC_3H_7)_4$), and/or tetra-methyl-hepta-diene zirconium ($Zr(C_{11}H_{19}O_2)_4$). Examples of the oxidizing agent may include an ozone ($O_3$) gas, an oxygen ($O_2$) gas, water vapor ($H_2O$), an oxygen ($O_2$) plasma and/or a remote oxygen ($O_2$) plasma. Examples of the titanium precursor may include tetra-tertiary-butoxy titanium ($Ti(OtBu)_4$), tetrakis-ethyl-methyl-amino titanium ($Ti[N(CH_3)(C_2H_5)_4]$), titanium ethoxide ($Ti(OEt)_4$), titanium iso-propoxide ($Ti(OC_3H_7)_4$), tetra-methyl-hepta-diene titanium ($Ti(C_{11}H_{19}O_2)_2$) and/or tetra-methyl-hepta-diene zirconium ($Zr(C_{11}H_{19}O_2)_4$).

According to example embodiments of the present invention, an oxygen diffusion barrier layer having thickness between about 2 Å and about 5 Å may be formed between the storage electrode and the dielectric layer so that an oxidation of the storage electrode may be effectively reduced or prevented in a re-oxidation of the dielectric layer so as to allow a desired capacitance.

BRIEF DESCRIPTION OF THE DRAWINGS

The above and other features and advantages of the present invention will become more apparent by describing in detailed example embodiments thereof with reference to the accompanying drawings, in which.

DESCRIPTION OF THE EMBODIMENTS

Figure 1:
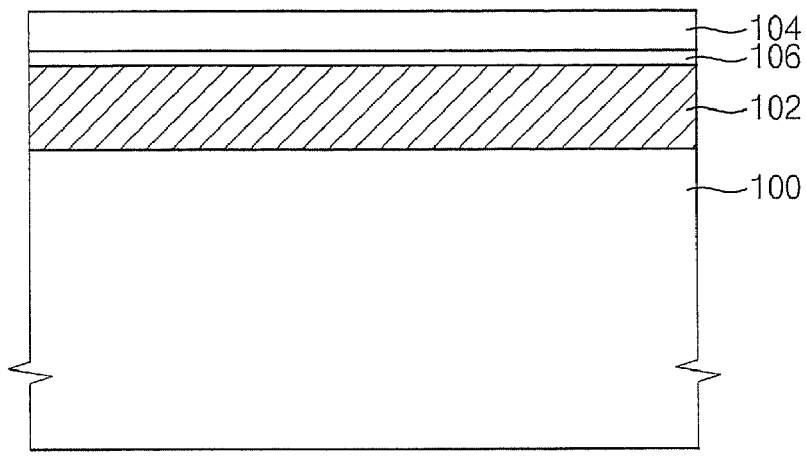
FIG. 1 is a cross-sectional view illustrating a multilayer structure in accordance with example embodiments of the present embodiment.

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, multilayer electrode structures according to example embodiments of the present invention will be explained in detail with reference to the accompanying drawings.

FIG. 1 is a cross-sectional view illustrating a multilayer electrode structure in accordance with example embodiments of the present embodiment.

Referring to FIG. 1, a conductive layer 102 including aluminum (Al) is provided on a substrate, such as a semiconductor substrate 100. In example embodiments, the conductive layer 102 may include a metal film including aluminum so that characteristics of the conductive layer 102 may be not changed in a re-oxidation process performed at between about 200° C. and about 400° C. For example, the conductive layer 102 may include a titanium aluminum nitride (TiAlN) film or a tantalum aluminum nitride (TaAlN) film.

An oxide layer 104 having a high dielectric constant is formed on the conductive layer 102. The oxide layer 104 may include zirconium oxide and/or titanium oxide.

An oxygen diffusion barrier layer 106 is formed at an interface between the conductive layer 102 and the oxide layer 104. The oxygen diffusion barrier layer 106 may be formed in a re-oxidation process.

In example embodiments of the present invention, the oxygen diffusion barrier layer 106 may include aluminum oxide. The oxygen diffusion barrier layer 106 may range in thickness from about 2 Å to about 5 Å. The thickness of the oxygen diffusion barrier layer 106 may be substantially the same as a thickness of an aluminum oxide film formed by performing one cycle of an atomic layer deposition (ADL) process. In other words, the oxygen diffusion barrier layer 106 may have a thickness substantially the same as that of a mono-layer. A thickness ratio between the oxide layer 104 and the oxygen diffusion barrier layer 106 may be in a range of about 15:1 to about 25:1.

When the oxygen diffusion barrier layer 106 has a thickness considerably thinner than that of the oxide layer 104, the oxygen diffusion barrier layer 106 may not have an affect on dielectric properties of the oxide layer 104, but may reduce or effectively prevent oxygen from diffusing into the conductive layer 102.

Hereinafter, methods of forming a multilayer structure according to example embodiments of the present invention will be described in detail with reference to the accompanying drawings.

Figure 2:
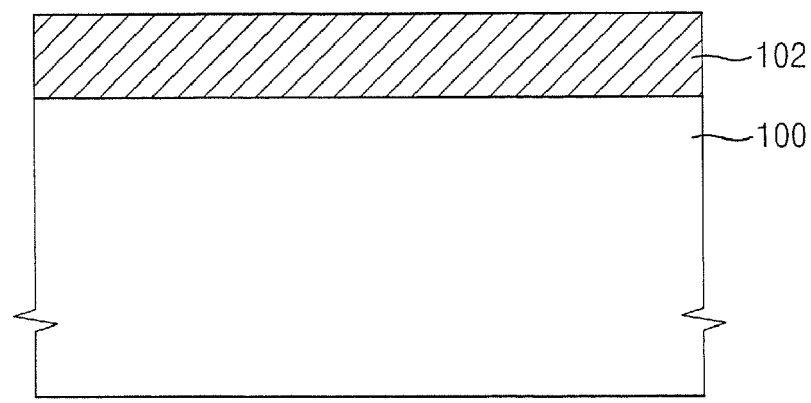
FIGS. 2 to 4 are cross-sectional views illustrating methods of forming a multilayer structure in accordance with example embodiments of the present invention.
Figure 3:
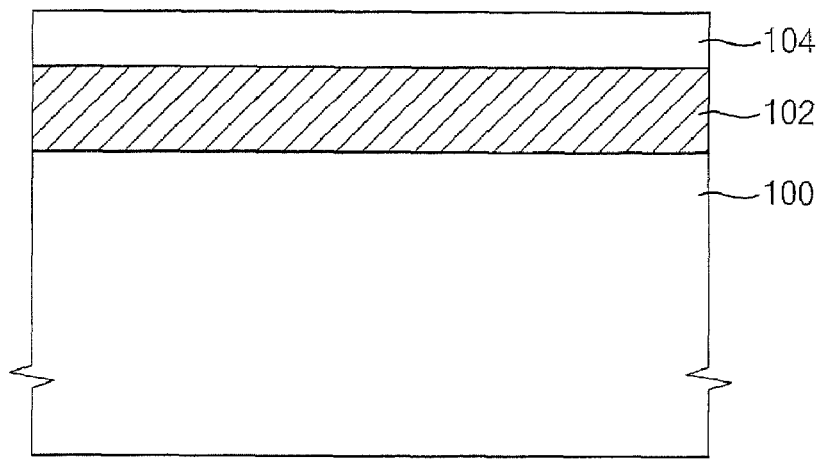
Figure 4:
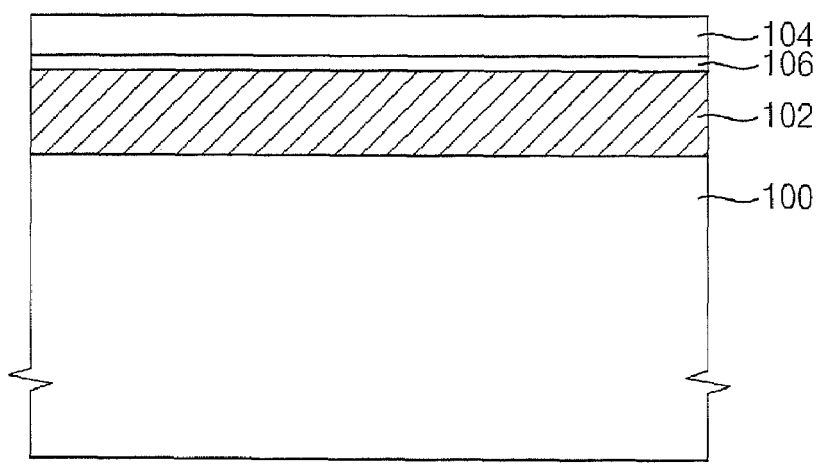

FIGS. 2 to 4 are cross-sectional views illustrating methods of forming a multilayer structure in accordance with example embodiments of the present invention.

Referring to FIG. 2, a conductive layer 102 including aluminum is formed on a substrate such as a semiconductor substrate 100. The semiconductor substrate 100 may include a plurality of conductive patterns formed thereon. The conductive layer 102 may include titanium aluminum nitride and/or tantalum aluminum nitride.

In example embodiments of the present invention, the semiconductor substrate 100 or the semiconductor substrate 100 having the conductive patterns may be loaded in a process chamber. A titanium precursor such as titanium chloride ($TiCl_4$) may be introduced into the process chamber. The titanium precursor may be chemically and physically absorbed to the semiconductor substrate 100 or the semiconductor substrate 100 having the conductive patterns.

A first purge gas may be introduced into the process chamber to remove remaining titanium precursor in the process chamber and physisorbed (i.e., physically absorbed) titanium precursor to the semiconductor substrate 100. The first purge gas may include an inactive gas such as an argon (Ar) gas, a helium (He) gas, a nitrogen ($N_2$) gas, etc.

A first nitrogen precursor such as ammonia ($NH_3$) may be introduced into the process chamber. The first nitrogen precursor may be chemically and physically absorbed to the titanium precursor chemisorbed (i.e., chemically absorbed) to the semiconductor substrate 100.

A second purge gas may be introduced into the process chamber to remove remaining first nitrogen precursor in the process chamber and physisorbed first nitrogen precursor. Accordingly, a titanium nitride film may be formed on the semiconductor substrate 100 or the semiconductor substrate 100 having the conductive patterns. The second purge gas may include an inactive gas such as an argon gas, a helium gas, a nitrogen gas, etc.

An aluminum precursor such as trimethyl aluminum (TMA) may be introduced into the process chamber. The aluminum precursor may be chemically and physically absorbed to the titanium nitride film.

A third purge gas may be introduced into the process chamber to remove remaining aluminum precursor in the process chamber and physisorbed aluminum precursor. The third purge gas may include an inactive gas such as an argon gas, a helium gas, a nitrogen gas, etc.

A second nitrogen precursor may be introduced into the process chamber. The second nitrogen precursor may include a material substantially the same as that of the first nitrogen precursor. For example, the second nitrogen precursor may include ammonia ($NH_3$). The second nitrogen precursor may be chemically and physically absorbed to the aluminum precursor chemisorbed to the titanium nitride film.

A fourth purge gas may be introduced into the process chamber to remove the second nitrogen precursor remaining in the process chamber and physisorbed second nitrogen precursor. Therefore, a titanium aluminum nitride film may be formed on the semiconductor substrate 100 or the semiconductor substrate 100 having the conductive patterns. The fourth purge gas may include an inactive gas such as an argon gas, a helium gas, a nitrogen gas, etc.

As described above, the titanium precursor, the first nitrogen precursor, the aluminum precursor and the second nitrogen precursor may be successively provided onto the semiconductor substrate 100 in the process chamber, such that the titanium aluminum nitride film having a thickness of about several Ångstroms may be formed on the semiconductor substrate 100. When the above-described cycle may be repeatedly carried out, a titanium aluminum nitride layer having a desired thickness may be formed on the semiconductor substrate 100. The titanium nitride layer of the desired thickness may correspond to the conductive layer 102.

Aluminum included in the titanium aluminum nitride layer may reduce or prevent the titanium aluminum nitride layer from being oxidized in a successive re-oxidation process because aluminum may serve as an anti-oxidizing agent in the re-oxidation process. This mechanism will be described later.

Referring to FIG. 3, an oxide layer 104 including zirconium oxide and/or titanium oxide is formed on the conductive layer 102.

In one example embodiment of the present invention, the semiconductor substrate 100 having the conductive layer 102 formed thereon may be loaded in a process chamber. A zirconium precursor may be provided into the process chamber. Examples of the zirconium precursor may include tetra-tertiary-butoxy zirconium ($Zr(OtBu)_4$), tetrakis-ethyl-methyl-amino zirconium ($Zr[N(CH_3)(C_2H_5)_4]$), zirconium iso-propoxide ($Zr(OC_3H_7)_4$), tetra-methyl-hepta-diene zirconium ($Zr(C_{11}H_{19}O_2)_4$), etc. The zirconium precursor may chemically and physically absorbed to a surface of the conductive layer 102. Then, a first purge process may be performed to remove physisorbed zirconium precursor and remaining zirconium precursor in the process chamber. An oxidizing agent may be introduced into the process chamber. The oxidizing agent may oxidize chemisorbed zirconium precursor. Examples of the oxidizing agent may include an ozone ($O_3$) gas, an oxygen ($O_2$) gas, water vapor ($H_2O$), an oxygen ($O_2$) plasma, a remote oxygen ($O_2$) plasma, etc. Thus, a zirconium oxide film may be formed on the conductive layer 102. When the zirconium precursor and the oxidizing agent are repeatedly introduced into the process chamber, a zirconium oxide layer having a desired thickness may be formed on the conductive layer 102. The zirconium oxide layer may correspond to the oxide layer 104.

In another example embodiment of the present invention, the semiconductor substrate 100 having the conductive layer 102 thereon may be loaded in a process chamber. A titanium precursor may be introduced into the process chamber. Examples of the titanium precursor may include tetra-tertiary-butoxy titanium ($Ti(OtBu)_4$), tetrakis ethyl methyl amino titanium ($Ti[N(CH_3)(C_2H_5)_4]$), titanium ethoxide ($Ti(OEt)_4$), titanium iso-propoxide ($Ti(OC_3H_7)_4$), tetra-methyl-hepta-diene titanium ($Ti(C_{11}H_{19}O_2)_2$), etc. The titanium precursor may be chemisorbed and physisorbed to a surface of the conductive layer 102. The physisorbed titanium precursor and remaining titanium precursor may be removed from the process chamber by a purge process. An oxidizing agent may be introduced into the process chamber. Examples of the oxidizing agent may include an ozone ($O_3$) gas, an oxygen ($O_2$) gas, water vapor ($H_2O$), an oxygen ($O_2$) plasma, a remote oxygen ($O_2$) plasma, etc. A titanium oxide layer film may be formed on the conductive layer 102. When the titanium precursor and the oxidizing agent are repeatedly introduced into the process chamber, a titanium oxide layer having a desired thickness may be formed on the conductive layer. The titanium oxide layer may correspond to the oxide layer 104.

The oxide layer 104 formed by the above-described process may have a high dielectric constant so that the oxide layer 104 formed on the conductive layer 102 may advantageously serve as a dielectric layer.

Referring to FIG. 4, an oxygen diffusion barrier layer 106 is formed at an interface between the conductive layer 102 and the oxide layer 104 by re-oxidizing the oxide layer 104.

In example embodiments of the present invention, a re-oxidation process may be performed on the semiconductor substrate 100 having the conductive layer 102 and the oxide layer 104. The re-oxidation process may be carried out using an oxygen plasma at between about 500 Pa and about 1,000 Pa pressure and between about 200° C. and about 400° C. temperature for about 2 minutes to about 5 minutes.

In the re-oxidation process, a sufficient amount of oxygen may be provided into the oxide layer 104 so that the oxide layer 104 may sufficiently include oxygen. In addition, zirconium oxide or titanium oxide in the oxide layer 104 may be crystallized between about 200° C. and about 400° C. such that the oxide layer 104 may be sufficiently crystallized in the re-oxidation process. Therefore, an additional heat treatment process for re-oxidizing the oxide layer 104 may be omitted.

While the re-oxidation process is executed at between about 200° C. and about 400° C., an aluminum oxide layer may be formed at the interface between the conductive layer 102 and the oxide layer 104. For example, aluminum in the conductive layer 102 may be oxidized in the re-oxidation process such that the aluminum oxide layer serving as the oxygen diffusion preventing layer 106 may be formed between the conductive layer 102 and the oxide layer 104.

The oxygen diffusion barrier layer 106 may have thickness of between about 2 Å and about 5 Å, which may be obtained by performing one cycle of an ALD process. That is, a thickness of the oxygen diffusion barrier layer 106 may be substantially the same as that of a mono-layer.

As the thickness of the oxygen diffusion barrier layer 106 including aluminum oxide increases, the oxygen diffusion barrier layer 106 may have a high dielectric constant although aluminum oxide has a relatively low dielectric constant. Thus, the oxygen diffusion barrier layer 106 may have a thickness considerably thinner than that of the oxide layer 104 so as to maintain dielectric characteristics of the oxide layer 104. As a result, the oxide layer 104 may advantageously serve as the dielectric layer because of the very thin oxygen diffusion barrier layer 106.

Hereinafter, capacitors according to example embodiments of the present invention will be described in detail with reference to the accompanying drawings.

Figure 5:
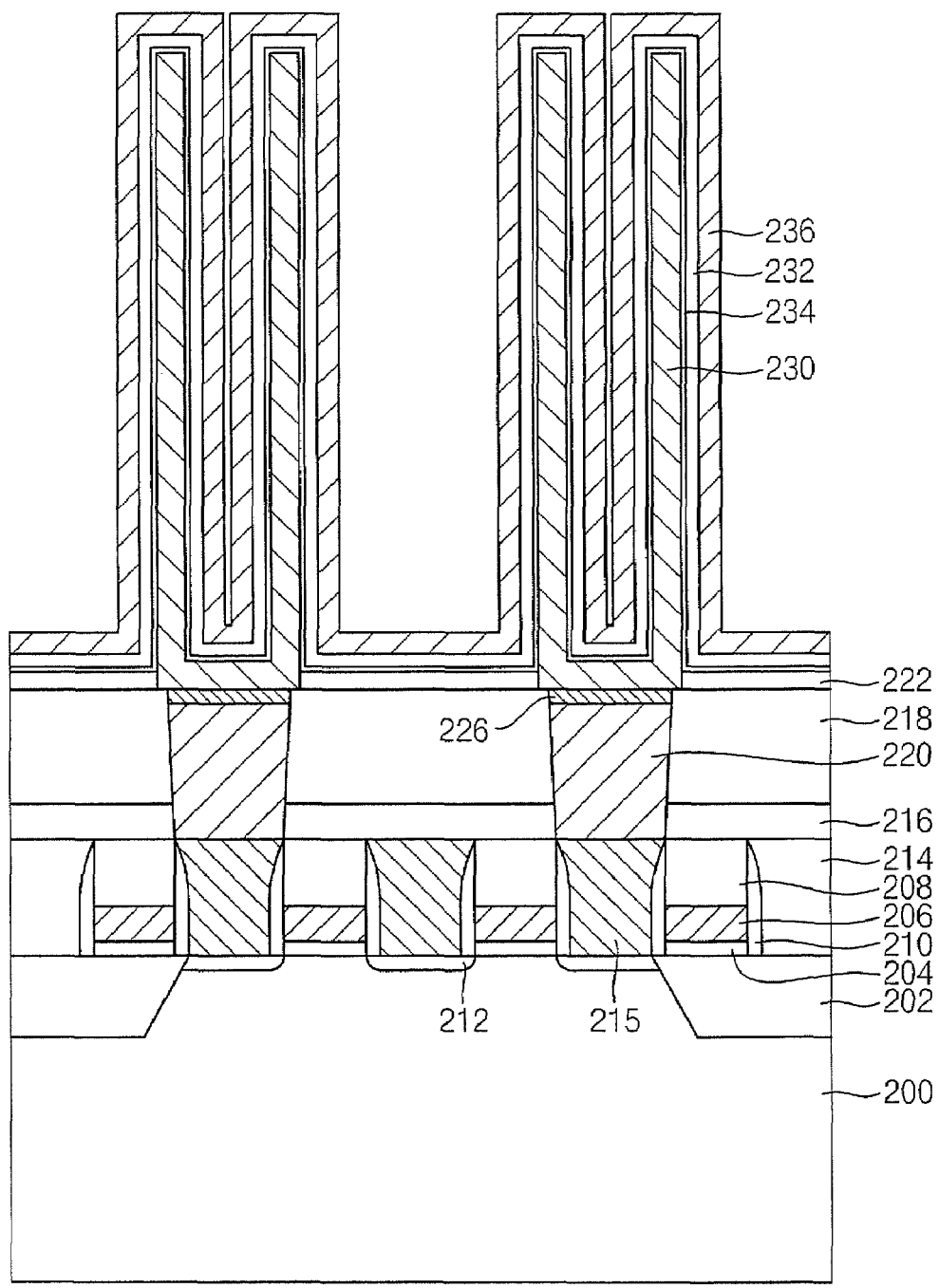
FIG. 5 is a cross-sectional view illustrating a capacitor in accordance with example embodiments of the present invention.

FIG. 5 is a cross-sectional view illustrating a capacitor in accordance with example embodiments of the present invention.

Referring to FIG. 5, a storage electrode 230 including aluminum is provided on a substrate such as a semiconductor substrate 200. An isolation layer 202 may be formed on the semiconductor substrate 200. A plurality of conductive patterns may be formed on the semiconductor substrate 200. For example, gate structures, impurity regions, pads and insulation structures may be provided between the semiconductor substrate 200 and the storage electrode 230. Each of the gate structures may include a gate oxide layer pattern 204, a gate conductive layer pattern 206 and a mask pattern 208 formed on the semiconductor substrate 200. A spacer 210 may be provided on a sidewall of each gate structure. Impurity regions 212 may be formed portions of the semiconductor substrate 200 adjacent to the gate structures. Pads 215 may be electrically connected to the impurity regions 212. A plurality of insulating interlayers may be provided on the semiconductor substrate 200 to cover the gate structure and the pads 215. Storage node contacts 220 may be formed through the insulating interlayers and titanium silicide layers 226 may be provided on the storage node contacts 220. The fabrication processes described in this paragraph can be conventional and need not be described further herein.

The storage electrode 230 may have a cylindrical shape electrically connected to the conductive patterns such as the storage node contact 226 and/or the pad pattern 226. The storage electrode 230 may correspond to a metal nitride layer including aluminum. Electric characteristics of the storage electrode 230 may not be changed in a successive re-oxidation process performed at between about 200° C. and about 400° C. For example, the storage electrode 230 may include titanium aluminum nitride and/or tantalum aluminum nitride.

A dielectric layer 232 including zirconium oxide and/or titanium oxide is formed on the storage electrode 230. The dielectric layer 232 may be uniformly formed on the storage electrode 230 so that an inside of the storage electrode 230 may not be completely filled with the dielectric layer 232.

The dielectric layer 232 including zirconium oxide and/or titanium oxide may have a desired thickness that ensures a sufficiently high dielectric constant and a low leakage current. When the dielectric layer 232 includes zirconium oxide, a thickness of the dielectric layer 232 may be about 100 Å.

An oxygen diffusion barrier layer 234 is formed at an interface between the storage electrode 230 and the dielectric layer 232. The oxygen diffusion barrier layer 234 may include aluminum oxide. The oxygen diffusion barrier layer 234 may be formed by the re-oxidation process for the dielectric layer 232.

The oxygen diffusion barrier layer 234 may be in a range of about 2 Å to about 5 Å in thickness. The thickness of the oxygen diffusion barrier layer 234 may be substantially the same as that of a mono-layer obtained by one cycle of an ALD process. When a thickness of the dielectric layer 232 is about 100 Å, a thickness ratio between the oxygen diffusion barrier layer 234 and the dielectric layer 232 may be in a range of about 1:15 to about 1:25.

The oxygen diffusion barrier layer 234 may have a relatively low dielectric constant and may reduce or prevent oxygen from diffusing into the storage electrode 230. Thus, the oxygen diffusion barrier layer 234 may be formed on the storage electrode 230 to be thin, thereby maintaining a high dielectric constant of the capacitor having the dielectric layer 232.

A plate electrode 236 is formed on the dielectric layer 232. The plate electrode 236 may include a metal such as radium or a metal nitride such as titanium nitride.

As described above, the capacitor including the storage electrode 230, the oxygen diffusion barrier layer 234, the dielectric layer 232 and the plate electrode 236 may be provided on the semiconductor substrate 200. The oxygen diffusion barrier layer 234 may reduce or prevent an oxidation of the storage electrode 230 which can improve electrical characteristics of the capacitor. Additionally, the capacitor may have a desired high capacitance because of the dielectric layer 232 having the high dielectric constant.

Hereinafter, methods of forming a capacitor according to example embodiments of the present invention will be described in detail with reference to the accompanying drawings.

FIGS. 6 to 10 are cross-sectional views illustrating methods of forming a capacitor in accordance with example embodiments of the present invention.

Figure 6:
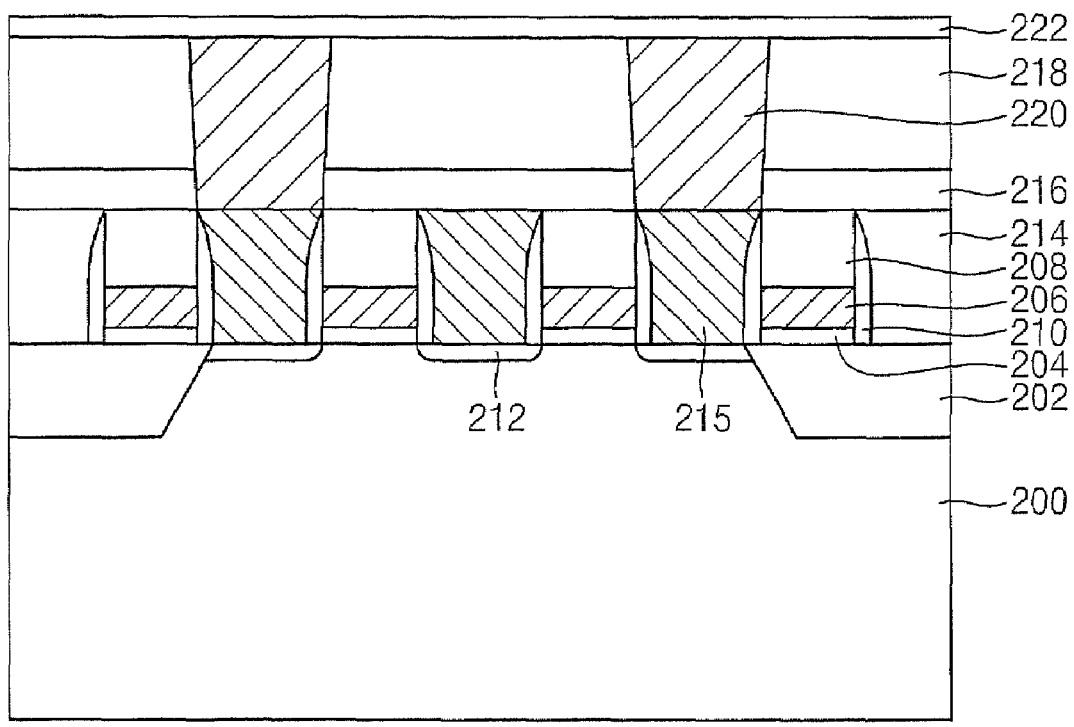
FIGS. 6 to 10 are cross-sectional views illustrating methods of forming a capacitor in accordance with example embodiments of the present invention.

Referring to FIG. 6, a substrate such as a semiconductor substrate 200 is divided into an active region and a field region by an isolation process. The field region may be formed in accordance with a formation of a trench isolation layer 202 so as to improve an integration degree of the capacitor.

A thin gate oxide layer pattern 204 is formed on the semiconductor substrate 200 including the isolation layer 202. The gate oxide layer may be formed by a thermal oxidation process or a chemical vapor deposition (CVD) process. Gate conductive layer patterns 206 and gate mask patterns 208 are formed on the gate oxide layer patterns 204, respectively. Thus, gate structures may be formed on the semiconductor substrate 200. Each of the gate structure includes the gate oxide layer pattern 204, the gate conductive layer pattern 206 and the gate mask pattern 208. The gate structures may be disposed as line shapes on the semiconductor substrate 200.

A silicon nitride layer is formed on the semiconductor substrate 200 to cover the gate structures, and then the silicon nitride layer is selectively removed by an anisotropic etching process. Hence, a gate spacer 210 is formed on a sidewall of each gate structure.

Impurities are implanted into portions of the semiconductor substrate 200 exposed between the gate structures using the gate structures as ion implantation masks. Then, source/drain regions 212 are formed on the semiconductor substrate 200 after a thermal treatment process is performed on the implanted impurities.

As a result, transistors having the gate structures and the source/drain regions 212 are formed on the semiconductor substrate 200. The line-shaped gate structures may serve as word lines. The source/drain regions 212 may be defined in accordance with an operation mode of each transistor. A bit line may be electrically connected to a source region whereas a capacitor may be electrically connected to a drain region.

A first insulating interlayer 214 is formed on the semiconductor substrate 200 to cover the transistors. The first insulating interlayer 214 may be formed using an oxide such as silicon oxide. The first insulating interlayer 214 is partially etched to form first contact holes (not shown) exposing the source/drain regions 216.

Pads 215 are formed in the first contact holes by filling the first contact holes with conductive materials.

A second insulating interlayer 216 is formed on the first insulating interlayer 214. The second insulating interlayer 216 may also be formed using an oxide such as silicon oxide. The second insulating interlayer 216 is partially etched to form a second contact hole (not shown) that exposes one of the pads 215 making contact with the source region. A conductive layer is formed in the second contact hole and on the second insulating interlayer 216, and then a bit line (not shown) and a bit line contact (not shown) are formed by patterning the conductive layer. The bit line contact may be positioned in the second contact hole and the bit line may be formed on the bit line contact.

A third insulating interlayer 218 is formed on the second insulating interlayer 216 to cover the bit line. The third insulating interlayer 218 may be formed using oxide. The third insulating interlayer 218 and the second insulating interlayer 216 are partially etched to form third contact holes (not shown) exposing the pads 215 electrically connected to the drain regions.

Storage node contacts 220 are formed in the third contact holes by filling the third contact holes with conductive materials, respectively. For example, the storage node contacts 220 may be formed using polysilicon.

In an example embodiment of the present invention, pad patterns (not shown) may be formed on the storage node contacts 220 so as to define portions where storage electrodes 230 (see FIG. 8) are positioned.

An etch-stop layer 222 is formed on the storage node contact 220 and the third insulating interlayer 218. The etch-stop layer 222 may be formed using a nitride such as silicon nitride.

Figure 7:
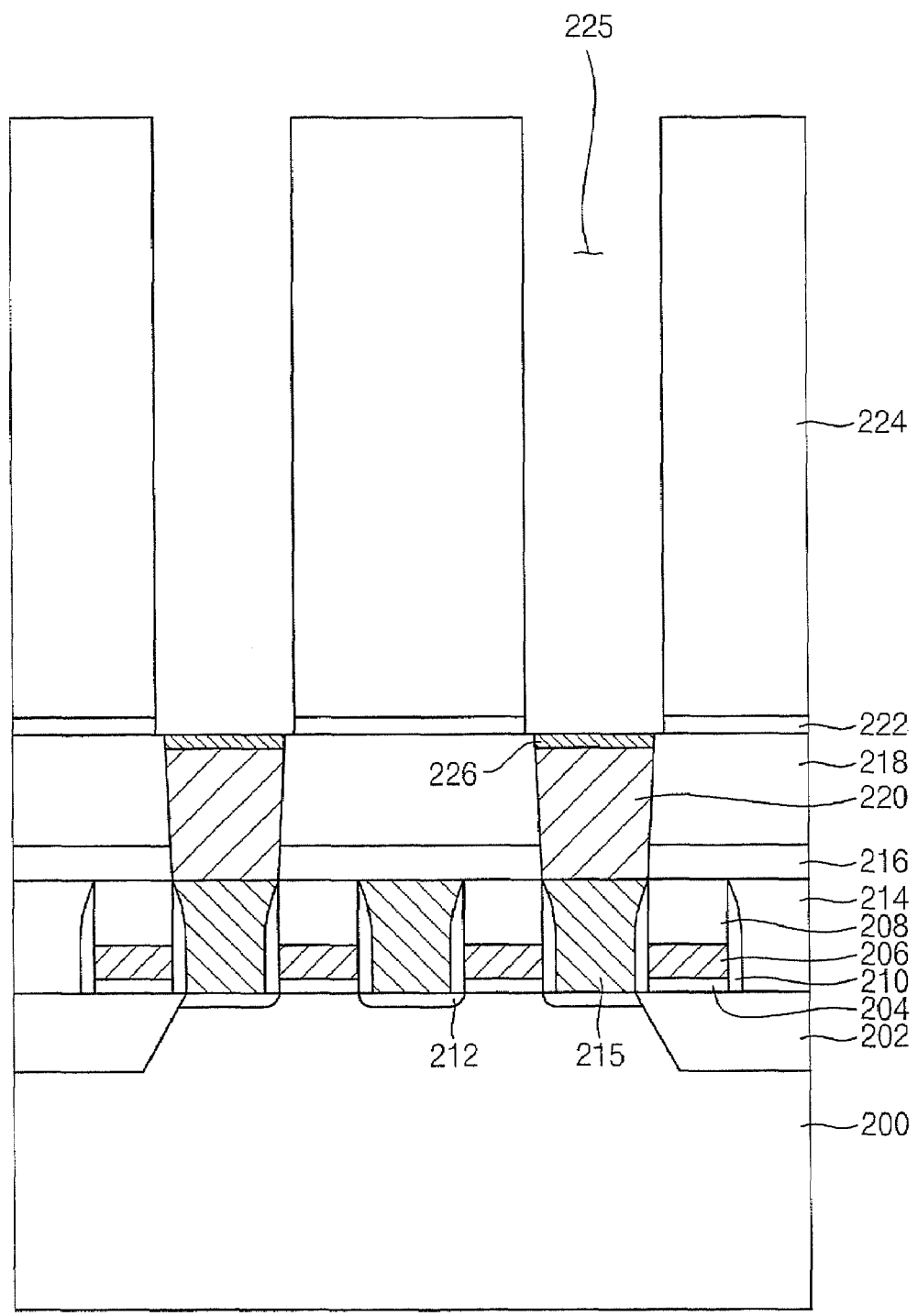

Referring to FIG. 7, a mold layer 224 is formed on the etch-stop layer 222. The mold layer 224 may be formed using an insulation material such as silicon oxide.

The mold layer 224 may serve as a mold for forming the storage electrode 230 having a cylindrical shape. The mold layer 224 may be formed using an oxide such as silicon oxide. A height of the storage electrode 230 having the cylindrical shape may mainly depend on a thickness of the mold layer 224. Thus, the thickness of the mold layer 224 may be controlled in accordance with a desired capacitance of the capacitor.

A hard mask pattern (not shown) is formed on the mold layer 224. The hard mask pattern may expose a portion of the mold layer 224 where the storage electrode 230 having the cylindrical shape is positioned. That is, the exposed portion of the mold layer 224 may correspond to an opening 225 for the storage electrode 230. The hard mask pattern may be formed using a material having a high selectivity relative to the mold layer 224. For example, the hard mask pattern may be formed using polysilicon.

The mold layer 224 and the etch-stop layer 222 are partially etched using the hard mask pattern as an etching mask so that the opening portion 225 exposing the storage node contact 220 is formed through the mold layer 224 and the etch-stop layer 222.

A titanium silicide layer 226 is formed on the storage node contact 220 exposed by the opening 225. The titanium silicide layer 226 may be easily formed on a layer of silicon whereas the titanium silicide layer 226 may be hardly formed on a layer of silicon oxide or silicon nitride. Accordingly, the titanium silicide layer 226 may be selectively formed on the storage node contact 220 except for the third insulating interlayer 218, the etch-stop layer 222 and the mold layer 224.

Figure 8:
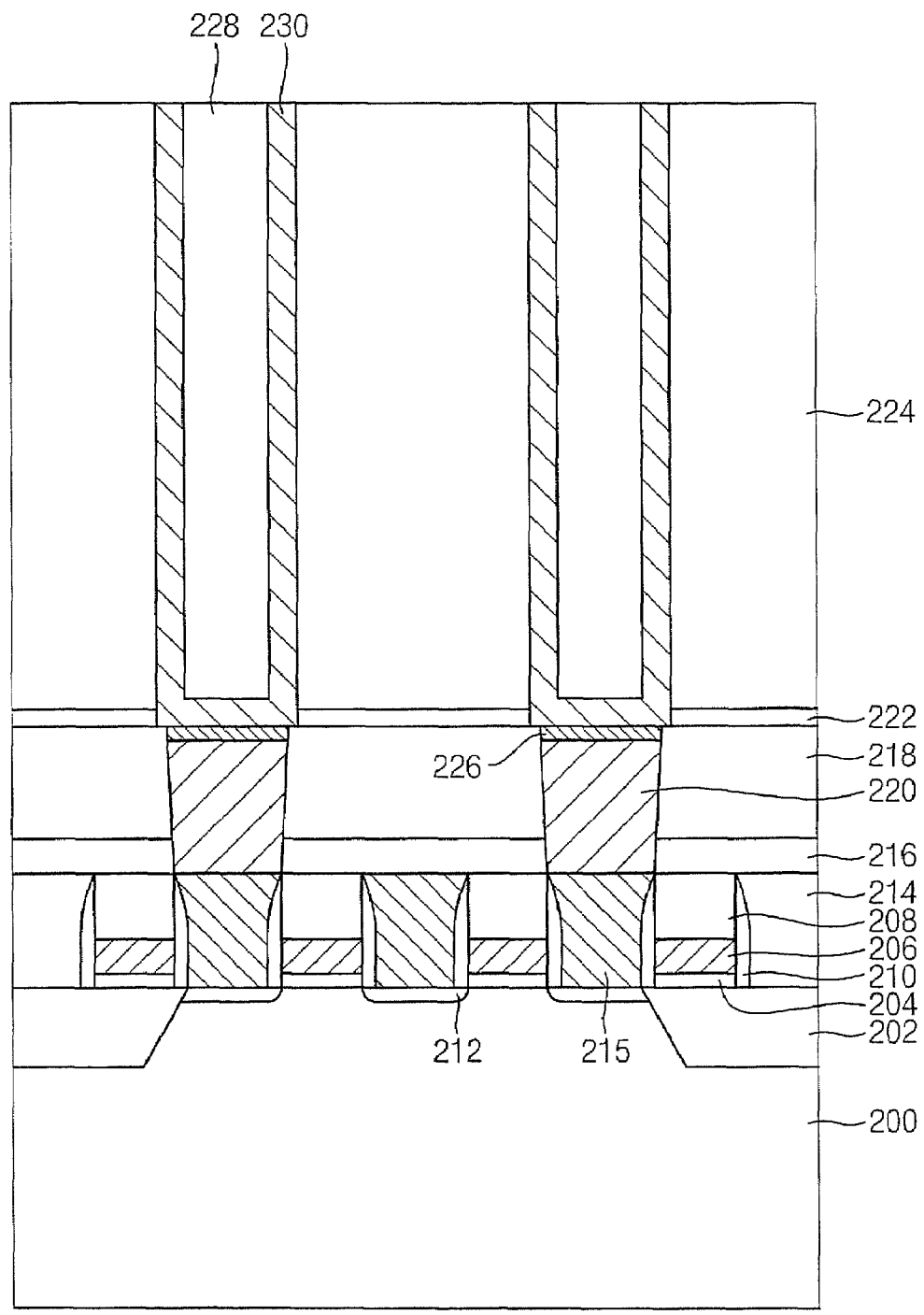

Referring to FIG. 8, a conductive layer (not shown) for forming the storage electrode 230 is formed on a sidewall of the opening 225, the titanium silicide layer 226 and the mold layer 224. The conductive layer may include aluminum so that the storage electrode 230 may not be oxidized in the successive re-oxidation process. For example, the conductive layer may be formed using titanium aluminum nitride and/or tantalum aluminum nitride because titanium aluminum nitride and tantalum aluminum nitride have the high anti-oxidation characteristics. In example embodiments, the conductive layer for the storage electrode 230 may be formed by a process substantially the same as the process described with reference to FIG. 2.

A sacrificial layer 228 is formed on the conductive layer for the storage electrode 230 to sufficiently fill up the opening 215. The sacrificial layer 228 may be formed using an oxide such as silicon oxide. For example, the sacrificial layer 228 may be formed using BoroPhosphoSilicate Glass (BPSG) or undoped silicate glass (USG).

The conductive layer and the hard mask pattern are removed until the mold layer 224 is exposed to form the storage electrode 230. The storage electrode 230 may be formed by a planarization process such as a chemical mechanical polishing (CMP) process and/or an etch-back process. That is, portions of the conductive layer on the sidewall of the opening 215 and the titanium silicide layer 226 may correspond to the storage electrode 230.

Figure 9:
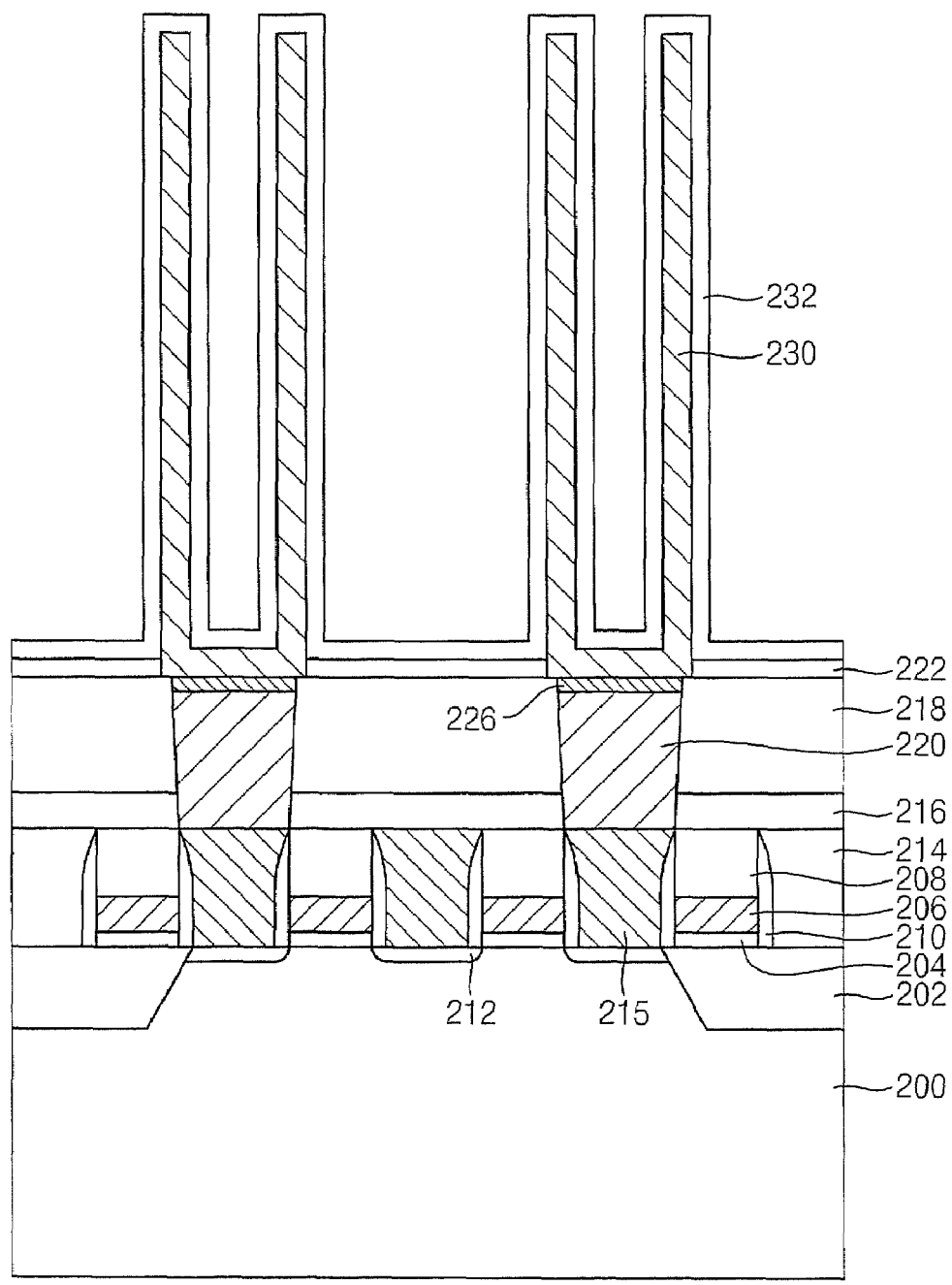

Referring to FIG. 9, after forming the storage electrode 230, the mold layer 224 is removed from the storage electrode 230. The mold layer 224 may be removed by a wet etching process. While removing the mold layer 224, the sacrificial layer 228 filling the opening 215 is simultaneously removed from the storage electrode 230 so that an inside and an outside of the storage electrode 230 are exposed.

A dielectric layer 232 is formed on the storage electrode 230. The dielectric layer 232 may be formed using a metal oxide such as zirconium oxide and/or titanium oxide. Thus, the dielectric layer 232 may have a high dielectric constant.

The dielectric layer 232 including the metal oxide may have crystallization temperature substantially lower than that of a dielectric layer including tantalum oxide. The dielectric layer 232 may be crystallized in the re-oxidation process performed at between about 200° C. and about 400° C. using an oxygen plasma. Therefore, an additional heat treatment for crystallizing the dielectric layer 232 may be omitted. The dielectric layer 232 including the metal oxide may be formed by a process substantially the same as that described with reference to FIG. 3.

Figure 10:
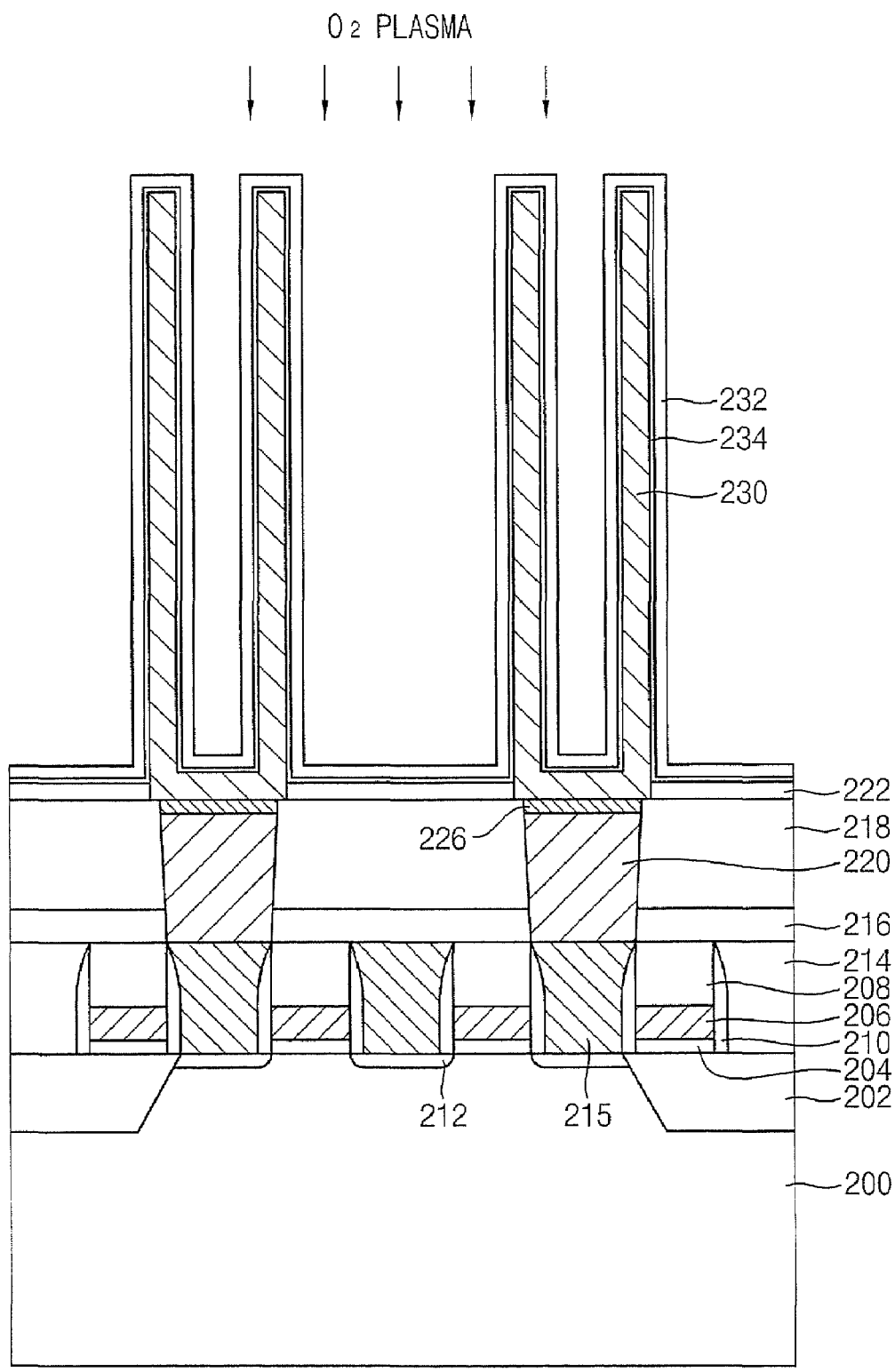

Referring to FIG. 10, an oxygen diffusion barrier layer 234 including aluminum oxide is formed at an interface between the storage electrode 230 and the dielectric layer 232 by the re-oxidation process. That is, the dielectric layer 232 is re-oxidized to form the oxygen diffusion barrier layer 234 between the storage electrode 230 and the dielectric layer 232. The re-oxidation process may be performed using the oxygen plasma process substantially the same as that described with reference to FIG. 4.

In the re-oxidation process, oxygen may be provided into the dielectric layer 232 so that the dielectric layer 232 may have a sufficient amount of oxygen. Thus, the dielectric layer 232 may provide a high dielectric constant. Further, aluminum in the storage electrode 230 may be partially oxidized to form the oxygen diffusion barrier layer 234 including aluminum oxide.

The oxygen diffusion barrier layer 234 may reduce and even prevent oxygen in the dielectric layer 232 from diffusing into the storage electrode 230 in the re-oxidation process performed using the oxygen plasma. The oxygen diffusion barrier layer 234 may have thickness between about 2 Å and about 5 Å, which may be substantially the same as that of a mono-layer of aluminum oxide obtained by one cycle of an ALD process.

Since the dielectric layer 232 has the thickness of about 100 Å and the oxygen diffusion barrier layer 234 has thickness between about 2 Å and about 5 Å, a thickness ratio between the dielectric layer 232 and the oxygen diffusion barrier layer 234 may be in a range of about 15:1 to about 25:1.

When the oxygen diffusion barrier layer 234 is relatively thick, dielectric characteristics of the dielectric layer 232 may be reduced because the oxygen diffusion barrier layer 234 has a relatively low dielectric constant. Therefore, the dielectric layer 232 may have a predetermined thickness to allow the high dielectric constant whereas the oxygen diffusion barrier layer 234 may have a thickness considerably thinner than that of the dielectric layer 232 without deteriorating the dielectric characteristics of the dielectric layer 232.

When the re-oxidation process is carried out at between about 200° C. and about 400° C., the metal oxide included in the dielectric layer 232 may be crystallized. Thus, manufacturing processes for the capacitor may be simplified by omitting an additional crystallization process for the dielectric layer 232.

As shown in FIG. 5, a plate electrode 236 is formed on the dielectric layer 232. The plate electrode 236 may be formed a metal such as radium and/or a metal nitride such as titanium nitride. As a result, the capacitor including the storage electrode 230, the oxygen diffusion barrier layer 234, the dielectric layer 232 and the plate electrode 236 is formed over the semiconductor substrate 200.

Since the oxygen diffusion barrier layer 234 and the dielectric layer 232 are formed on the storage electrode 230, the diffusion of oxygen into the storage electrode 230 may be reduced or effectively prevented in the re-oxidation process. Additionally, the oxygen diffusion barrier layer 234 may be much thinner than that of the dielectric layer 232 such that the dielectric layer 232 may sufficiently provide the high dielectric constant for the desired capacitance of the capacitor.

According to example embodiments of the present invention, an oxygen diffusion barrier layer that is quite thin may be formed between a storage electrode including aluminum and a dielectric layer including metal oxide. Hence, an oxidation of the storage electrode may be reduced or efficiently prevented. Further, the dielectric layer having a high dielectric constant may be formed on the oxygen diffusion barrier layer so that a capacitor including the dielectric layer may have a desired capacitance.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of forming a multilayer electrode structure comprising:
   forming a conductive layer including aluminum;
   forming an oxide layer on the conductive layer, the oxide layer including zirconium oxide or titanium oxide;
   re-oxidizing the oxide layer using an oxygen plasma to form an oxygen diffusion barrier layer including aluminum oxide at an interface between the conductive layer and the oxide layer; and
   forming a plate electrode on the oxide layer that has been reoxidized, to provide a capacitor.

2. The method of claim 1, wherein the conductive layer is formed using a titanium precursor including titanium chloride ($TiCl_4$), at least one nitrogen precursor including ammonia ($NH_3$) and an aluminum precursor including trimethyl aluminum (TMA).

3. The method of claim 1, wherein the oxide layer is formed using a zirconium precursor and an oxidizing agent and/or using a titanium precursor and an oxidizing agent.

4. The method of claim 3, wherein the zirconium precursor includes at least one selected from the group consisting of tetra-tertiary-butoxy zirconium ($Zr(OtBu)_4$), tetrakis-ethyl-methyl-amino zirconium ($Zr[N(CH_3)(C_2H_5)_4]$), zirconium iso-propoxide ($Zr(OC_3H_7)_4$), and tetra-methyl-hepta-diene zirconium ($Zr(C_{11}H_{19}O_2)_4$), and the oxidizing agent includes at least one selected from the group consisting of an ozone ($O_3$) gas, an oxygen ($O_2$) gas, water vapor ($H_2O$), an oxygen ($O_2$) plasma and a remote oxygen ($O_2$) plasma.

5. The method of claim 3, wherein the titanium precursor includes at least one selected from the group consisting of tetra-tertiary-butoxy titanium ($Ti(OtBu)_4$), tetrakis-ethyl-methyl-amino titanium ($Ti[N(CH_3)(C_2H_5)_4]$), titanium ethoxide ($Ti(OEt)_4$), titanium iso-propoxide ($Ti(OC_3H_7)_4$), tetra-methyl-hepta-diene titanium ($Ti(C_{11}H_{19}O_2)_2$) and tetra-methyl-hepta-diene zirconium ($Zr(C_{11}H_{19}O_2)_4$) and the oxidizing agent includes at least one selected from the group consisting of an ozone ($O_3$) gas, an oxygen ($O_2$) gas, water vapor ($H_2O$), an oxygen ($O_2$) plasma and a remote oxygen ($O_2$) plasma.

6. The method of claim 1, wherein the oxide layer is crystallized during re-oxidizing the oxide layer.

7. The method of claim 1, wherein the oxygen diffusion barrier layer is formed at between about 200° C. and about 400° C. for about 2 to about 5 minutes.

8. The method of claim 1, wherein the conductive layer including aluminum is formed using a titanium precursor including titanium chloride, at least one nitrogen precursor including ammonia and an aluminum precursor including trimethyl aluminum.

* * * * *